United States Patent [19]

Sato et al.

[11] Patent Number: 5,955,241
[45] Date of Patent: Sep. 21, 1999

[54] CHEMICAL-AMPLIFICATION-TYPE NEGATIVE RESIST COMPOSITION AND METHOD FOR FORMING NEGATIVE RESIST PATTERN

[75] Inventors: Mitsuru Sato, Hillsboro, Oreg.; Kiyoshi Ishikawa, Kanagawa, Japan; Hiroyuki Yamazaki, Kanagawa, Japan; Yoshiki Sugeta, Kanagawa, Japan; Toshimasa Nakayama, Kanagawa, Japan

[73] Assignee: Tokyo Ohka Kogyo Co., Ltd., Kanagawa, Japan

[21] Appl. No.: 08/956,792

[22] Filed: Oct. 23, 1997

[30] Foreign Application Priority Data

Oct. 25, 1996 [JP] Japan .................................. 8-300919

[51] Int. Cl.$^6$ .................................................. G03C 1/492
[52] U.S. Cl. ..................... 430/270.1; 430/325; 430/919; 430/921
[58] Field of Search ................................ 430/325, 270.1, 430/919, 921

[56] References Cited

U.S. PATENT DOCUMENTS 5,227,276  7/1993  Roeschert et al. ...................... 430/252
5,547,812  8/1996  Collins et al. ....................... 430/270.1
5,595,855  1/1997  Padmanaban et al. .............. 430/270.1

FOREIGN PATENT DOCUMENTS 361907      4/1990   European Pat. Off. .
A-0589451   3/1994   European Pat. Off. .
A-6-35194   2/1994   Japan .
A-7-311463  11/1995  Japan .

*Primary Examiner*—John A. McPherson
*Assistant Examiner*—Rosemary Ashton
*Attorney, Agent, or Firm*—Sughrue, Mion, Zinn, Macpeak & Seas, PLLC

[57] ABSTRACT

The present invention provides a chemical-amplification-type negative resist composition and a method for forming a negative resist pattern using the same. The chemical-amplification-type negative resist composition comprises (A) an alkali-soluble resin, (B) an acid-generating agent, and (C) a compound capable of causing crosslinking reaction in the presence of an acid, wherein the ingredient (A) is a mixture comprising (i) a copolymer which comprises constitutional repeating units of a hydroxystyrene type, has a weight average molecular weight of 2,000 to 4,000, and has a ratio of the weight average molecular weight to the number average molecular weight falling within 1.0 to 2.0; and (ii) a hydroxystyrene homopolymer, and wherein the dissolution rate of the ingredient (A) at 23° C. in a 2.38% by weight tetramethylammonium hydroxide aqueous solution falls within 80 to 300 nm/s.

10 Claims, No Drawings

CHEMICAL-AMPLIFICATION-TYPE NEGATIVE RESIST COMPOSITION AND METHOD FOR FORMING NEGATIVE RESIST PATTERN

BACKGROUND OF THE INVENTION

1. Field of the Invention

The present invention relates to chemical-amplification-type negative resist compositions. More particularly, it relates to a chemical-amplification-type negative resist composition which exhibits high sensitivity, high definition and excellent thermostability, can be patterned into films of various thicknesses, and achieves a resist pattern having an excellent profile. Additionally, it relates to a method for forming a negative resist pattern using the chemical-amplification-type negative resist composition.

2. Description of the Related Art

Recently, since electronic parts such as semiconductor devices and liquid-crystal display devices are progressively finely manufactured, higher sensitivity and definition are required of resists used for manufacturing such parts, and resist patterns should be formed so as to have more excellent profiles. Concerning resists satisfying such requirements, attention is paid to chemical-amplification-type resists whose solubilities in developer solutions vary according to a catalytic action by an acid generated by the irradiation of radiant rays, and a large number of chemical-amplification-type negative resist compositions have been proposed.

In the manufacture of electronic parts using such a chemical-amplification-type negative resist composition, photolithography is employed, in which the chemical-amplification-type negative resist composition is applied onto a substrate such as a silicon wafer, the resultant is then subjected to irradiation through a mask pattern and developed to form a resist pattern, and etching is performed using the resist pattern as a protective film. As to the radiant rays used in photolithography, increasingly preferred are shorter wavelength rays such as ultraviolet rays, deep UV, and excimer laser beams derived from KrF, ArF or the like. Further, the use of an electron beam or a X ray has been considered as a practical option.

For achieving satisfactory sensitivity to such shorter wavelength radiant rays and for obtaining a satisfactory resist pattern, each ingredient in the chemical-amplification-type negative resist composition should be less absorptive for the radial rays. In this view, conventionally used novolak resins cannot be used as resin ingredients of such compositions due to their high absorptivities at such wavelengths, and polyvinylphenol-based polymers have been used since they are less absorptive at such wavelengths. Actually, chemical-amplification-type negative resist compositions containing such polyvinylphenol-based polymers as resin ingredients have been disclosed in, for example, Japanese Patent Laid-Open Nos. 1-293339, 2-15270, 4-163552, 6-67433 and 7-311463. The compositions are, however, inferior in definition.

Aiming to improve definition, Japanese Patent Laid-Open No. 7-238196 discloses a chemical-amplification-type negative resist composition containing an alkali-soluble resin, 4-hydroxystyrene-styrene copolymer, whose styrene content is 5 to 20 mole % and whose weight average molecular weight is 6,000 to 25,000.

The uses of the chemical-amplification-type negative resist composition disclosed in that publication, however, results in a resist pattern inferior in contrast. Further, in any chemical-amplification-type negative resist composition, when the thickness of the resist film is 2.0 $\mu$m or more, and particularly 3.0 $\mu$m or more, the obtained resist patterns may be mutually crosslinked, namely, a so-called micro-bridging phenomenon may occur, or the top surfaces of the resist patterns may readily become round. In particular, since a thickness of 2.0 $\mu$m, and more preferably 3.0 $\mu$m, is required of a photoresist film for ion plantation, there is a strong demand for a resist composition capable of achieving high definition even when a thicker resist film should be formed.

SUMMARY OF THE INVENTION

In the above-described viewpoints, the inventors earnestly conducted several investigations, and have accomplished the present invention based on the following finding: A chemical-amplification-type negative resist composition containing a resin ingredient whose dissolution rate at 23° C. in a 2.38% by weight tetramethylammonium hydroxide aqueous solution is controlled within a specific range exhibits high definition and high sensitivity to ultraviolet rays, deep UV, excimer laser beams derived from KrF, ArF or the like, and electron beams; and further, such composition can be patterned into films of various thicknesses, is highly thermostable, and is capable of achieving a resist pattern having an excellent profile.

Accordingly, an object of the present invention is to provide a chemical-amplification-type negative resist composition which exhibits high sensitivity to radiant rays, high definition and satisfactory thermostability even when processed into films of various thicknesses, and which is capable of achieving a resist pattern having an excellent profile.

In addition, another object of the present invention is to provide a method for forming a negative resist pattern using such a chemical-amplification-type negative resist composition.

To achieve the aforementioned objects, according to the present invention there is provided a chemical-amplification-type negative resist composition comprising:

(A) an alkali-soluble resin;

(B) a compound capable of generating an acid by the irradiation of a radiant ray; and (C) a compound capable of causing crosslinking reaction in the presence of an acid, wherein the ingredient (A) is a mixture comprising:

(i) a copolymer which comprises constitutional repeating units of a hydroxystyrene type, has a weight average molecular weight (MW) of 2,000 to 4,000, and has a ratio of MW to the number average molecular weight (MN), i.e. MW/MN, of 1.0 to 2.0; and (ii) a hydroxystyrene homopolymer, and wherein the dissolution rate of the ingredient (A) at 23° C. in a 2.38% by weight tetramethylammonium hydroxide aqueous solution falls within 80 to 300 nm/s.

Additionally, the present invention provides a method for forming a negative resist pattern using the above-described chemical-amplification-type negative resist composition.

DETAILED DESCRIPTION OF THE INVENTION

As described above, the ingredient (i) in the ingredient (A) is a copolymer including hydroxystyrene-type constitutional repeating units. More specifically, the copolymer comprises hydroxystyrene-type units such as hydroxystyrene and α-alkylhydroxystyrene, and non-hydroxystyrene type constitutional repeating units.

Preferred examples of monomers which form said non-hydroxystyrene-type constitutional repeating units are hydroxystyrene whose hydroxyl group is replaced with another group, and monomers each containing an α,β-unsaturated double bond. Alkali-solubility-suppressing groups which are not liberated by acid are used as said another group substituted for the hydroxyl group of a hydroxystyrene. Examples of such alkali-solubility-suppressing groups include substituted or non-substituted benzenesulfonyloxy groups, substituted or non-substituted naphthalenesulfonyloxy groups, substituted or non-substituted benzenecarbonyloxy groups, and substituted or non-substituted naphthalenecarbonyloxy groups. Typical examples of substituted or non-substituted benzenesulfonyloxy groups include the benzenesulfonyloxy group, chlorobenzenesulfonyloxy groups, methylbenzenesulfonyloxy groups, ethylbenezenesulfonyloxy groups, propylbenezenesulfonyloxy groups, methoxybenezenesulfonyloxy groups, ethoxybenezenesulfonyloxy groups, propoxybenezenesulfonyloxy groups, and acetaminobenezenesulfonyloxy groups. Typical examples of substituted or non-substituted naphthalenesulfonyloxy groups include the naphthalenesulfonyloxy group, chloronaphthalenesulfonyloxy groups, methylnaphthalenesulfonyloxy groups, ethylnaphthalenesulfonyloxy groups, propylnaphthalenesulfonyloxy groups, methoxynaphthalenesulfonyloxy groups, ethoxynaphthalenesulfonyloxy groups, propoxynaphthalenesulfonyloxy groups, and acetaminonaphthalenesulfonyloxy groups. Further, typical examples of substituted or non-substituted benzenecarbonyloxy or naphthalenecarbonyloxy groups include the groups which have the same benzene- or naphthalene-based structure as the above-listed substituted or non-substituted sulfonyloxy groups but contain a carbonyloxy portion instead of the sulfonyloxy portion. Among the above-listed examples, acetaminobenezenesulfonyloxy groups and acetaminonaphthalenesulfonyloxy groups are particularly preferred.

Meanwhile, typical examples of monomers each containing an α,β-unsaturated double bond include styrene-type monomers such as styrene, chlorostyrene, chloromethylstyrene, vinyltoluene and α-methylstyrene; acrylate-type monomers such as methyl acrylate, methyl methacrylate and phenyl methacrylate; and vinyl-acetate-type monomers such as vinyl acetate and vinyl benzoate. Styrene is especially preferred. Copolymers derived from combinations of hydroxystyrene compounds and styrene compounds, such as poly(4-hydroxystyrene-styrene) and poly(4-hydroxystyrene-methylstyrene), are preferred since they are effective in achieving high definition and high thermostability.

Examples of the ingredient (ii) used in the present invention include polymers which are synthesized from radical or ionic polymerization of hydroxystyrene monomers such as p-hydroxystyrene, and those of α-alkylhydroxystyrene monomers such as α-methylhydroxystyrene and α-ethylhydroxystyrene. Poly(p-hydroxystyrene) is especially preferred.

As to the ingredient (i), the weight average molecular weight should preferably fall within 2,000 to 4,000 and more preferably 2,300 to 3,000, and the ratio of the weight average molecular weight (MW) against the number average molecular weight (MN) should preferably fall within 1.0 to 2.0 and more preferably 1.1 to 1.5 (hereinafter the ratio is referred to as molecular weight distribution). With a weight average molecular weight below 2,000, developing properties, thermostability and others cannot be satisfactory. Meanwhile, with a weight average molecular weight above 4,000, definition is markedly lowered. Further, with a molecular weight distribution above 2.0, patterning cannot be stably performed, the crosslinking rate and the crosslinking degree may be irregular, and uneven development readily occurs.

Further, the dissolution rate of the ingredient (i) at 23° C. in a 2.38% by weight tetramethylammonium hydroxide aqueous solution (hereinafter referred to as "dissolution rate") may preferably fall within 50 to 200 nm/s, more preferably 60 to 150 nm/s, and further preferably 80 to 100 nm/s. With a dissolution rate below 50 nm/s, the achieved contrast will be markedly low. Meanwhile, with a dissolution rate above 200 nm/s, thickness reduction may occur in the photoset portion of the resulting resist film. Here, the term "dissolution rate" is defined as the degree of thickness reduction (nm) per an unit time period (second) observed when a film formed by applying an alkali-soluble resin dissolved in a solvent onto a silicon wafer to a thickness of approximately 1.0 μm and then heating at 110° C. for 90 sec is dipped in a 2.38% by weight tetramethylammonium hydroxide aqueous solution at 23° C.

In order to adjust the dissolution rate of the ingredient (i) within the above-described range, the mole ratio of the hydroxystyrene-type structural units to the non-hydroxystyrene-type structural units may preferably fall within 80:20 to 90:10, and more preferably 80:20 to 85:15. By mixing the ingredient (i) satisfying such a mole ratio with the ingredient (ii), the dissolution rate of the ingredient (A) can be adjusted at 80 to 300 nm/s. Such a mixture system comprising the ingredients (i) and (ii) is especially preferred for forming a resist pattern having a thickness of 3.0 μm or more, since a chemical-amplification-type negative resist composition prepared using such a mixture system exhibits superior sensitivity and shaping properties.

Incidentally, for forming a resist pattern having a thickness of 3.0 μm or more, the ingredient (A) may preferably be prepared so as to have a dissolution rate which falls within 150 to 300 nm/s, and more preferably 200 to 250 nm/s. To this end, the mixing weight ratio of the ingredient (i) to the ingredient (ii) may preferably be 2:1 to 1:2, and more preferably, it may be approximately 1:1.

In the present invention, it is important to adjust the dissolution rates of the ingredient (A) and the ingredient (i) at the above-described ranges, respectively. The object of the present invention can be achieved by using a mixture comprising the ingredient (A) on condition that such dissolution rates are satisfied, the ingredient (B) and the ingredient (C). As to the ingredient (ii) mixed with the ingredient (i), the weight average molecular weight may preferably fall within 2,000 to 4,000 and the molecular weight distribution should preferably fall within 1.0 to 2.0, for a well-balanced relationship between the crosslinking rate and the crosslinking degree, and for prevention of uneven development.

As the ingredient (B) used in the present invention, conventionally known compounds capable of generating an acid by irradiation of a radiant ray can be used without any special limitation. Examples of such acid-generating compounds (agents) include the following compounds classified into the groups (a) to (j).

(a) Bissulfonyldiazomethanes

Typical examples include bis(p-toluenesulfonyl) diazomethane, bis(1,1-dimethylethylsulfonyl) diazomethane, bis(cyclohexylsulfonyl)diazomethane, and bis(2,4-dimethylphenylsulfonyl)diazomethane.

(b) Nitrobenzyl Derivatives

Typical examples include 2-nitrobenzyl p-toluenesulfonate, 2,6-dinitrobenzyl p-toluenesulfonate, and 2,4-dinitrobenzyl p-trifluoromethylbenzenesulfonate.

(c) Aliphatic- or Aromatic-Sulfonic Esters of Pyrogallol

Typical examples include methanesulfonic ester of pyrogallol (pyrogallol trimesylate), benzenesulfonic ester of pyrogallol, and p-toluenesulfonic ester of pyrogallol.

(d) Sulfonic Esters of N-Hydroxyimide Compounds

Typical examples include the compounds represented by the following chemical formulae, respectively.

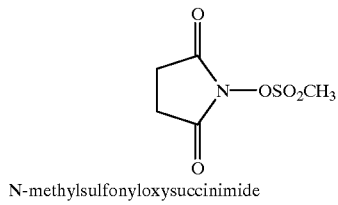

N-methylsulfonyloxysuccinimide

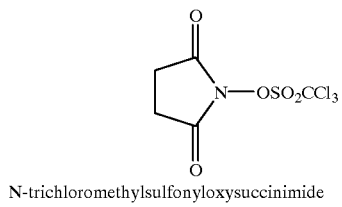

N-trichloromethylsulfonyloxysuccinimide

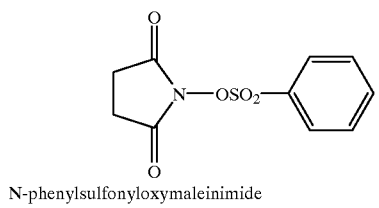

N-phenylsulfonyloxymaleinimide

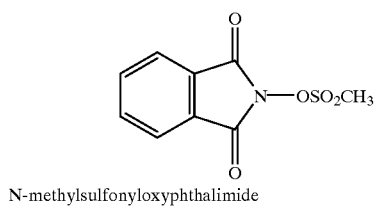

N-methylsulfonyloxyphthalimide (e) Halogen-Containing Triazine Compounds

Typical examples include 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)- 1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, and tris(2,3-dibromopropyl)-1,3,5-triazine.

(f) Compounds Represented by General Formula 1

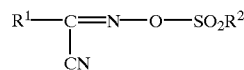

1

In the general formula 1 above, each of $R^1$ and $R^2$ is independently a substituted or non-substituted saturated or unsaturated hydrocarbon group or an aromatic compound group, provided that at least one of $R^1$ and $R^2$ is not an aromatic compound group. Here, an "aromatic compound group" is a group derived from a compound exhibiting physical and chemical properties inherent in aromatic compounds. Examples of such groups include aromatic hydrocarbon groups such as the phenyl group and the naphthyl group, and heterocyclic groups such as the furyl group and the thienyl groups, and the benzene or heterocyclic rings of these groups may have one or more of substituents such as a halogen atom, an alkyl group, an alkoxy group and a nitro group. Further, $R^2$ may preferably be an alkyl group having 1 to 4 carbon atoms such as a methyl group, an ethyl group, a propyl group and a butyl group.

(g) Compounds Represented by General Formula 2

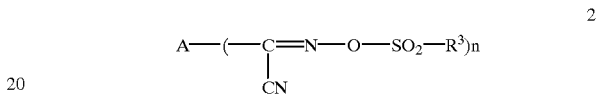

2

In the general formula 2 above, A is a divalent or trivalent organic group, $R^3$ is a substituted or non-substituted hydrocarbon group, and n is 2 or 3.

Examples of non-substituted hydrocarbon groups preferred as $R^3$ include straight or branched alkyl groups having 1 to 6 carbon atoms such as the methyl group, the ethyl group, the propyl group, the isopropyl group, the n-butyl group, the sec-butyl group and the tert-butyl group; and straight or branched alkenyl groups such as the ethenyl group, the propenyl group, the butenyl group and the butadienyl group.

On the other hand, examples of substituted hydrocarbon groups preferred as $R^3$ include the substituted alkyl or alkenyl groups derived from the above-described alkyl or alkenyl groups, wherein each of said substituted alkyl or alkenyl groups has one or more substituents such as a halogen atom, e.g. a chlorine atom, a bromine atom and a fluorine atom, a hydroxyl group, an alkoxy group, and an acyl group. Especially preferred substituted hydrocarbon groups are halogenoalkyl groups such as the chloromethyl group, the trichloromethyl group, the trifluoromethyl group, and the 2-bromopropyl group.

Meanwhile, examples of divalent or trivalent organic groups especially preferred as A are divalent or trivalent aliphatic or aromatic hydrocarbon groups.

The below-described oximesulfonate compounds (I) to (VII) can be listed as typical examples of compounds represented by the general formula 2.

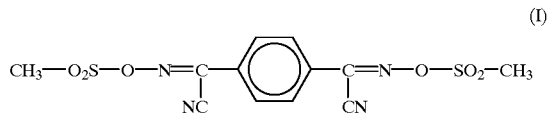

(I)

(II)

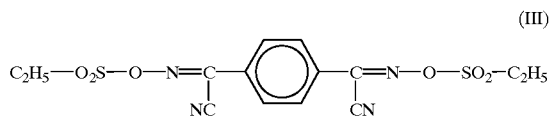

(III)

-continued

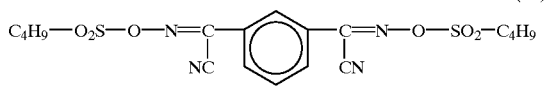

(IV)

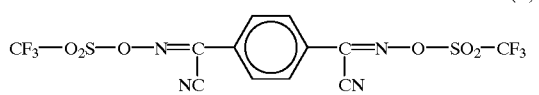

(V)

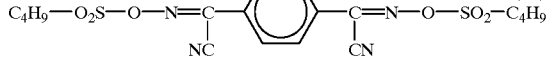

(VI)

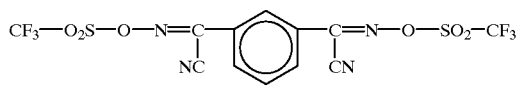

(VII)

(h) Compounds Represented by General Formula 3

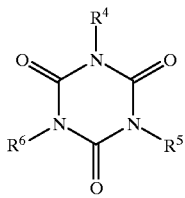

3

In the general formula 3 above, $R^4$, $R^5$ and $R^6$ are halogenated alkyl groups, wherein all or two of them may be identical, or all of them may be mutually different.

(i) Onium Salts

Typical examples include bis(p-tert-butylphenyl) iodonium trifluoromethanesulfonate and triphenylsulfonium trifluoromethanesulfonate.

(j) Benzoin-Tosylate-Type Acid-Generating Agents

Any of the above-listed acid-generating compounds can be used alone, or in combination with one or more others.

Among the above-listed acid-generating compounds, the compounds represented by the general formula 1 are preferred in the case where an i ray (365 nm) is used. In such a case, more preferably, $R^1$ is an aromatic compound group and $R^2$ is a lower alkyl group. Especially preferred acid-generating compounds represented by the general formula 1 are the compounds in which $R^1$ is a phenyl group, a methylphenyl group or a methoxyphenyl group, and $R^2$ is a methyl group. Typical and preferred examples of such compounds are α-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl) acetonitrile. In particular, α-(methylsulfonyloxyimino)-1-phenylacetonitrile is preferred for forming a thicker film of 3.0 to 6.0 μm thickness in view of its superior transparency.

In the meantime, when a resist film is formed, sublimates may be generated from the film during a drying step, a heating step or the like, and they may adhere to and stain the inside of the manufacturing apparatus. In view of the effect of inhibiting such sublimate generation, the compounds represented by the general formula 2 are preferably used as acid-generating compounds.

Further, the acid-generating compounds represented by the general formula 3 are preferred when an excimer laser is used. Especially preferred is tris(2,3-dibromopropyl) isocyanurate.

Preferably, the content of the acid-generating agent is 0.5 to 30 parts by weight relative to 100 parts by weight of the ingredient (A). Sufficient effect cannot be obtained with a content below 0.5 parts by weight. On the other hand, with a content above 30 parts by weight, the acid-generating compound cannot be completely dissolved in the solvent, and the miscibility with the resin ingredient will be lowered.

As the ingredient (C) used in the present invention, conventionally known crosslinking agents capable of causing crosslinking reaction in the presence of an acid can be used without any special limitation. Examples of such crosslinking agents include hydroxyl- or alkoxyl-group-containting amino resins such as methoxymethylated melamine resins, ethoxymethylated melamine resins, propoxymethylated melamine resins, butoxymethylated melamine resins, methoxyrnethylated urea resins, alkoxymethylated melamine resins and alkoxymethylated urea resins; alkoxyl-group-containing benzene compounds; hydroxyl- or alkoxyl-group-containing phenol compounds; and the compounds described in Japanese Patent Laid-Open Nos. 4-215668 and 7-306531. Commercially available examples of alkoxymethylated melamine resins include, in trade name, Nikalac MX-750, Nikalac MX-706, Nikalac MX-101, Nikalac MX-032, Nikalac MX-708, Nikalac MX-40, Nikalac MX-31, Nikalac MS-11, Nikalac MW-22 and Nikalac MW-30 manufactured by Sanwa Chemical Co., Ltd., and those of alkoxymethylated urea resins include, in trade name, Nikalac MX-290 and Nikalac N-2009 manufactured by Sanwa Chemical Co., Ltd.

The content of the above crosslinking agent may preferably be 3 to 70 parts by weight relative to 100 parts by weight of the ingredient (A). A resist pattern cannot satisfactorily formed with a content below, 3 parts by weight, and the degree of development will deteriorate with a content above 70 parts by weight.

In addition to the above-described ingredients, the chemical-amplification-type negative resist composition of the present invention may further contain an organic carboxylic acid ingredient and/or an amine ingredient in order to improve stability for long time periods and widen the exposure latitude. Any types of organic carboxylic acids such as saturated or non-saturated aliphatic carboxylic acids, alicyclic carboxylic acids, oxycarboxylic acids, alkoxycarboxylic acids, ketocarboxylic acids and aromatic carboxylic acids can be used as the organic carboxylic acid ingredient without any special limitation, though alicyclic carboxylic acids, unsaturated aliphatic carboxylic acids and aromatic carboxylic acids are preferably used.

Typically, examples of saturated aliphatic carboxylic acids include monovalent or polyvalent carboxylic acids such as formic acid, acetic acid, propionic acid, butyric acid, isobutyric acid, oxalic acid, malonic acid, succinic acid, glutaric acid, and adipic acid; examples of alicyclic carboxylic acids include 1,1-cyclohexanedicarboxylic acid, 1,2-cyclohexanedicarboxylic acid, 1,3-cyclohexanedicarboxylic acid, 1,4-cyclohexanedicarboxylic acid and 1,1-cyclohexyldiacetic acid; examples of unsaturated aliphatic carboxylic acids include acrylic acid, crotonic acid, isocrotonic acid, 3-butenoic acid, methacrylic acid, 4-pentenoic acid, propiolic acid, 2-butynoic acid, maleic acid, fumaric acid and acetylenecarboxylic acid; examples of oxycarboxylic acids include oxyacetic acid; examples of alkoxycarboxylic acids include methoxyacetic acid and ethoxyacetic acid; and examples of ketocarboxylic acids include pyruvic acid.

Further, typical examples of aromatic carboxylic acids include p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, isophthalic acid, and the commercially available phenol compound SAX (trade name, manufactured by Mitsui Toatsu Chemicals, Inc.). Especially preferred are the benzoic acid compounds each having a substituent at the ortho position, such as o-hydroxybenzoic acid, o-nitrobenzoic acid and phthalic acid.

Each of the above-listed aromatic carboxylic acids can be used solely or in combination with one or more others. According to the addition of such an aromatic carboxylic acid, a resist pattern having a satisfactory sectional shape can be formed, and the resist pattern exhibits superior stability after exposure, namely, it exhibits an excellent profile regardless of the time period from the end of the exposure treatment to the beginning of the heating treatment.

The content of the organic carboxylic acid ingredient may preferably fall within 0.01 to 3 parts by weight relative to 100 parts by weight of the ingredient (A). The effect derived from the addition of the organic carboxylic acid is insufficient with a content below 0.01 parts by weight. On the other hand, the degree of development will be lowered with a content above 3 parts by weight.

Meanwhile, as the amine ingredient, aliphatic amines, aromatic amines, heterocyclic amines and the like can be used in the present invention. Typical examples of aliphatic amines include methylamine, dimethylamine, trimethylamine, ethylamine, diethylamine, triethylamine, n-propylamine, di-n-propylamine, tri-n-propylamine, isopropylamine, and tripentylamine. Typical examples of aromatic amines include benzylamine, aniline, N-methylaniline, N,N-dimethylaniline, o-methylaniline, m-methylaniline, p-methylaniline, N,N-diethylaniline, diphenylamine, and di-p-tolylamine. Typical examples of heterocyclic amines include pyridine, o-methylpyridine, o-ethylpyridine, 2,3-dimethylpyridine, 4-ethyl-2-methylpyridine, and 3-ethyl-4-methylpyridine. Preferred examples are strong-basic and low-boiling point amines, for example, aliphatic amines such as methylamine, dimethylamine, trimethylamine, ethylamine, diethylamine, triethylamine and tripentylamine, and especially preferred are triethylamine and tripentylamine. Each of the above-listed amines can be used solely or in combination with one or more others.

The content of the amine ingredient may preferably fall within 0.01 to 5 parts by weight relative to 100 parts by weight of the ingredient (A).

Additionally, the chemical-amplification-type negative resist composition of the present invention may further contain a light-absorbing ingredient. Examples of compounds which can be used as the light-absorbing ingredient include naphthoquinone-1,2-diazide-5-sulfonic esters of polyphenols such as 1-[1-(4-hydroxyphenyl)isopropyl]-4-[1,1-bis(4-hydroxyphenyl)ethyl]benzene and bis(4-hydroxy-3,5-dimethylphenyl)-3,4-dihydroxyphenylmethane; benzophenone; 2,2',4,4'-tetrahydroxybenzophenone; 2,3,3',4,4',5'-hexahydroxybenzophenone; 4-dimethylamino-2',4'-dihydroxybenzophenone; 5-amino-3-methyl-1-phenyl-4-(4-hydroxyphenylazo)pyrazole; 4-dimethylamino-4'-hydroxyazobenzene; 4-diethylamino-4'-ethoxyazobenzene; 4-diethylaminoazobenzene; and curcumine.

The addition of such a light-absorbing ingredient is effective in improvement of sensitivity and definition, and the resulting resist pattern does not exhibit a wavy sectional shape but exhibits a suitable rectangular sectional shape.

The content of the light-absorbing ingredient may preferably fall within 0.5 to 15 parts by weight relative to 100 parts by weight of the ingredient (A). With a content above 15 parts by weight, the profile of the resulting resist pattern will be unsatisfactory.

As occasion demands, the resist composition of the present invention may further contain one or more miscible additives, for example, an additional resin for improving the performance of the resulting resist film, a plasticizer, a stabilizer, a coloring agent, a surfactant, and a coupling agent such as hexamethyldisilazane, within a content range not affecting the performance of the resist composition.

On the practical use, the resist composition of the present invention containing the above-described ingredients may preferably be dissolved in a solvent. Examples of solvents used therefor include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, and monomethyl, monoethyl, monopropyl, monobutyl or monophenyl ether of dipropylene glycol or dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate and ethyl ethoxypropionate. Each of these compounds may be used solely or in combination with one or more others.

Practically, the chemical-amplification-type negative resist composition of the present invention may be used, for example, in the following manner: The resist composition is dissolved in a solvent as listed above to prepare a coating solution; the coating solution is then applied onto a substrate such as a silicon wafer or a glass substrate to a thickness of approximately 0.5 to 6.0 $\mu$m according to a conventionally known coating method such as a spinner coating method, and subsequently dried to form a resist film; next, the resist film is irradiated with an ultraviolet ray, deep UV, or an excimer laser beam or scanned with an electron beam, through a desired mask pattern using a reducing-type projection aligner, and then heated; and the non-exposed portions of the film are dissolved and removed by dipping in a developer solution, for example, an alkaline aqueous solution such as a 1 to 10% by weight tetramethylammonium hydroxide aqueous solution, thus forming a resist pattern. In the case where a resist film having a thickness less than 3.0 $\mu$m should be formed, the dissolution rate of the ingredient (A) may preferably be adjusted to 80 to 300 nm/s. Further, in the case where a relatively thicker resist film, for example, a 3.0 to 6.0 $\mu$m thickness resist film, used as a mask for implanting phosphorus or boron ions into a silicon substrate or polysilicon, i.e. ion plantation, should be formed, the ingredient (A) may preferably be formed by mixing the ingredient (i) and the ingredient (ii) such that the dissolution rate of the ingredient (A) be 150 to 300 nm/s, and more preferably 200 to 250 nm/s.

EXAMPLES

The present invention will be further illustrated in detail with reference to the examples below.

Example 1

Initially, a negative resist solution was prepared as follows: An alkali-soluble resin ingredient (dissolution rate=230 nm/s) was prepared by mixing 50 parts by weight of a poly-p-hydroxystyrene (dissolution rate=400 nm/s) having a weight average molecular weight of 2,500 and a molecular weight distribution (MW/MN) of 1.13 with 50 parts by weight of a p-hydroxystyrene-styrene copolymer [p-hydroxystyrene:styrene=85:15 (mole ratio), dissolution rate=98 nm/s] having a weight average molecular weight of 2,500 and a molecular weight distribution (MW/MN) of 1.23; the alkali-soluble resin ingredient was then dissolved in 180 parts by weight of propylene glycol monomethyl ether acetate together with 15 parts by weight of a melamine resin, Nikalac MW-100LM manufactured by Sanwa Chemical Co., Ltd.; and 15 parts by weight of α-(methylsulfonyloxyimino)-1-phenylacetonitrile was further added and dissolved as an acid-generating agent.

Next, the above-prepared resist solution was applied onto a silicon wafer using a spinner, and dried on a hot plate at 110° C. for 90 sec. to form a resist film having a thickness of 3.0 μm. The resist film was then selectively irradiated with an i ray using a reducing-type projection aligner NSR2005i10D (manufactured by Nikon Corporation), heated at 110° C. for 90 sec., subjected to development in a 2.38% by weight tetramethylammonium hydroxide aqueous solution at 23° C. for 65 sec., washed with water for 30 sec., and dried. The sensitivity was 150 ms, and the definition was 0.6 μm. Incidentally, the sensitivity was defined as the exposure time period (ms) to obtain a resist pattern comprising, after development, lines and spaces in a width ratio of 1:1 as a result of replicating 1.0 μm width lines and spaces, and the definition was defined as the limit of resolution at the exposure value for replicating a mask pattern comprising 1.0 μm width lines and spaces.

The above-obtained resist pattern comprising 1.0 μm width lines and spaces was subjected to a SEM (Scanning Electron Microscopy) photographic observation of the sectional shape, and found to have a sectional shape comprising rectangles perpendicular to the substrate. Further, the side surfaces of the line patterns were not wavy, and the top surfaces of the line patterns were only slightly round. Accordingly, the resist pattern could be evaluated as satisfactory.

Example 2

A resist film having a thickness of 3.0 μm was formed on a substrate in the same manner as Example 1, except that the resist solution further contained 3.0 parts by weight of 2,3,3',4,4',5'-hexahydroxybenzophenone in addition to the ingredients of the resist solution used in Example 1, and the amount of propylene glycol monomethyl ether acetate was changed from 180 parts by weight to 247 parts by weight.

From the above-obtained resist film, a resist pattern was formed in the same manner as Example 1, and the sensitivity and definition were found to be 280 ms and 0.6 μm, respectively. The thus-obtained resist pattern comprising 1.0 μm width lines and spaces was subjected to a sectional-shape observation, and found to have a sectional shape comprising rectangles perpendicular to the substrate. The shape of the resist pattern was evaluated as satisfactory since the side surfaces of the line patterns did not exhibit wavy appearance and also the top surfaces of the line patterns did not exhibit round appearance.

Example 3

Initially, a negative resist solution was prepared as follows: An alkali-soluble resin ingredient (dissolution rate=250 nm/s) was prepared by mixing 60 parts by weight of a poly-p-hydroxystyrene (dissolution rate=400 nm/s) having a weight average molecular weight of 2,500 and a molecular weight distribution (MW/MN) of 1.13 with 40 parts by weight of a p-hydroxystyrene-styrene copolymer [p-hydroxystyrene:styrene=85:15 (mole ratio), dissolution rate=98 nm/s] having a weight average molecular weight of 2,500 and a molecular weight distribution (MW/MN) of 1.23; the alkali-soluble resin ingredient was then dissolved in 226 parts by weight of propylene glycol monomethyl ether acetate together with 10 parts by weight of a melamine resin, Nikalac MW-100LM manufactured by Sanwa Chemical Co., Ltd.; and a combination of 0.5 parts by weight of α-(methylsulfonyloxyimino)-1-(p-methoxyphenyl) acetonitrile and 3.0 parts by weight of the above-described compound (IV) was further dissolved as an acid-generating agent in the resulting mixture.

Next, a resist film having a thickness of 4.0 μm was formed on a substrate in the same manner as Example 1.

From the above-obtained resist film, a resist pattern was formed in the same manner as Example 1, and the sensitivity and definition were found to be 280 ms and 0.6 μm, respectively. The thus-obtained resist pattern comprising 1.0 μm width lines and spaces was subjected to a sectional-shape observation, and found to have a sectional shape comprising rectangles perpendicular to the substrate. Further, the side surfaces of the line patterns were not wavy, and the top surfaces of the line patterns were only slightly round. Accordingly, the resist pattern could be evaluated as satisfactory.

Example 4

A resist film having a thickness of 1.2 μm was formed on a substrate in the same manner as Example 1, except that a combination of 15 parts by weight of α-(methylsulfonyloxyimino)-1-(p-methylphenyl) acetonitrile and 5 parts by weight of α-(methylsulfonyloxyimino)-1-(p-methoxyphenyl) acetonitrile was used as an acid-generating agent instead of 15 parts by weight of α-(methylsulfonyloxyimino)-1-phenylacetonitrile, and the amount of propylene glycol monomethyl ether acetate was changed from 180 parts by weight to 414 parts by weight.

From the above-obtained resist film, a resist pattern was formed in the same manner as Example 1, and the sensitivity and definition were found to be 90 ms and 0.4 μm, respectively. The thus-obtained resist pattern comprising 1.0 μm width lines and spaces was subjected to a sectional-shape observation, and found to have a sectional shape comprising rectangles perpendicular to the substrate. The resist pattern was evaluated as satisfactory since the side surfaces of the line patterns did not exhibit wavy appearance and also the top surfaces of the line patterns did not exhibit round appearance.

Comparative Example 1

A resist pattern was formed in the same manner as Example 1, except that 50 parts by weight of a poly-p- hydroxystyrene (dissolution rate=400 nm/s) having a weight average molecular weight of 2,500 and a molecular weight distribution (MW/MN) of 1.13 was used instead of 50 parts by weight of the p-hydroxystyrene-styrene copolymer [phydroxystyrene:styrene=85:15 (mole ratio), dissolution rate=98 nm/s] having a weight average molecular weight of 2,500 and a molecular weight distribution (MW/MN) of 1.23. The sensitivity and definition were 300 ms and 0.6 $\mu$m, respectively.

The above-obtained resist pattern comprising 1.0 $\mu$m width lines and spaces was subjected to a sectional-shape observation through a SEM photograph, and found to have numerous microbridges between the line patterns and to have severely suffered from thickness-reduction in the upper portions of the line patterns.

Comparative Example 2

A resist pattern was formed in the same manner as Example 1, except that total 100 parts by weight of the polymers, i.e. the poly-p-hydroxystyrene and the p-hydroxystyrene-styrene copolymer, was changed to 100 parts by weight of a p-hydroxystyrene-styrene copolymer [p-hydroxystyrene:styrene=85:15 (mole ratio), dissolution rate=17 nm/s] having a weight average molecular weight of 5,000 and a molecular weight distribution (MW/MN) of 1.23. The sensitivity and definition were 200 ms and 0.75 $\mu$m, respectively.

The above-obtained resist pattern comprising 1.0 $\mu$m width lines and spaces was subjected to a sectional-shape observation through a SEM photograph, and found to have a sectional shape comprising tapering rectangles and to exhibit severely inferior contrast.

Comparative Example 3

Initially, a negative resist solution was prepared as follows: In 617 parts by weight of propylene glycol monomethyl ether acetate, 100 parts by weight of a poly-p-hydroxystyrene [dissolution rate=400 nm/s] having a weight average molecular weight of 3,500 and a molecular weight distribution (MW/MN) of 2.10 was dissolved together with 15 parts by weight of a melamine resin, Nikalac MW-30 manufactured by Sanwa Chemical Co., Ltd; and, as an acid-generating agent, 3.5 parts by weight of $\alpha$-(methylsulfonyloxyimino)-1-phenylacetonitrile, 2.0 parts by weight of 2,2',4,4'-tetrahydroxybenzophenone, 0.5 parts by weight of tripentylamine and 0.5 parts by weight of o-oxybenzoic acid was further dissolved in the resulting mixture.

Next, the above-prepared resist solution was applied onto a silicon wafer using a spinner, and dried on a hot plate at 100° C. for 90 sec. to form a resist film having a thickness of 0.8 $\mu$m. The resist film was then selectively irradiated with an i ray using a reducing-type projection aligner NSR2005i10D (manufactured by Nikon Corporation), heated at 120° C. for 90 sec., subjected to development in a 2.38% by weight tetramethylammonium hydroxide aqueous solution at 23° C. for 65 sec., washed with water for 30 sec., and dried. The sensitivity was 420 ms, and the definition was 0.40 $\mu$m. Incidentally, the sensitivity was defined as the exposure time period (ms) to obtain a resist pattern comprising, after development, lines and spaces in a width ratio of 1:1 as a result of replicating 0.5 $\mu$m width lines and spaces, and the definition was defined as the limit of resolution at the exposure value for replicating a mask pattern comprising 0.5 $\mu$m width lines and spaces.

The above-obtained resist pattern comprising 0.5 $\mu$m width lines and spaces was subjected to a sectional-shape observation through a SEM photograph, and found to comprise line patterns suffering from thickness-reduction and thus exhibiting an appearance round in the upper portions and trailing in the lower portions.

Comparative Example 4

A resist pattern was formed in the same manner as Comparative Example 3, except that a p-hydroxystyrene-styrene copolymer [p-hydroxystyrene:styrene=70:30 (mole ratio), dissolution rate=40 nm/s] having a weight average molecular weight of 1,500 and a molecular weight distribution (MW/MN) of 1.26 was used instead of the poly-p-hydroxystyrene [dissolution rate=400 nm/s] having a weight average molecular weight of 3,500 and a molecular weight distribution (MW/MN) of 2.10. The sensitivity and definition were 240 ms and 0.50 $\mu$m, respectively.

The above-obtained resist pattern comprising 0.5 $\mu$m width lines and spaces was subjected to a sectional-shape observation through a SEM photograph, and found to have post-development film-residues between the line patterns and to exhibit severely inferior contrast.

Comparative Example 5

A resist pattern was formed in the same manner as Comparative Example 3, except that a p-hydroxystyrene-styrene copolymer [p-hydroxystyrene:styrene=85:15 (mole ratio), dissolution rate=17 nm/s] having a weight average molecular weight of 5,000 and a molecular weight distribution (MW/MN) of 1.23 was used instead of the poly-p-hydroxystyrene [dissolution rate=400 nm/s] having a weight average molecular weight of 3,500 and a molecular weight distribution (MW/MN) of 2.10. The sensitivity and definition were 180 ms and 0.45 $\mu$m, respectively.

The above-obtained resist pattern comprising 0.5 $\mu$m width lines and spaces was subjected to a sectional-shape observation through a SEM photograph, and found to have post-development film-residues between the line patterns even after development and to exhibit severely inferior contrast.

As described above, the chemical-amplification-type negative resist composition of the present invention exhibits high sensitivity, high definition and superior thermostability, and is capable of achieving a resist pattern having an excellent profile. Thicker resist pattern also can readily be formed by using the chemical-amplification-type negative resist composition of the present invention. For example, a resist pattern having a thickness of 3.0 to 6.0 $\mu$m and an excellent profile can be formed by using such a resist composition including the ingredient (A) comprising a mixture of the ingredients (i) and (ii) in combination with a selective irradiation using an active ray of 300 to 500 nm.

While the invention has been described in detail and with reference to specific embodiments thereof, it will be apparent to one of ordinary skill in the art that various changes and modifications can be made therein without departing from the spirit and scope thereof.

What is claimed is:

1. A chemical-amplification-type negative resist composition comprising:

(A) an alkali-soluble resin;

(B) a compound capable of generating an acid by the irradiation of a radiant ray; and (C) a compound capable of causing crosslinking reaction in the presence of an acid;

wherein said ingredient (A) is a mixture comprising:

(i) a copolymer which comprises constitutional repeating units of a hydroxystyrene type, has a weight average molecular weight of 2,000 to 4,000, and has a ratio of the weight average molecular weight to the number average molecular weight falling within 1.0 to 2.0; and (ii) a hydroxystyrene homopolymer; and wherein the dissolution rate of said ingredient (A) at 23° C. in a 2.38% by weight tetramethylammonium hydroxide aqueous solution falls within 80 to 300 nm/s;

wherein said copolymer of the ingredient (i) comprises constitutional repeating units of a hydroxystyrene type and constitutional repeating units of a non-hydroxystyrene type, and said non-hydroxystyrene-type constitutional repeating units are hydroxystyrene constitutional repeating units whose each hydroxyl group is replaced with an alkali-solubility suppressing group which is not liberated by acid.

2. A chemical-amplification-type negative resist composition comprising:

(A) an alkali-soluble resin;

(B) a compound capable of generating an acid by the irradiation of a radiant ray; and (C) a compound capable of causing crosslinking reaction in the presence of an acid;

wherein said ingredient (A) is a mixture comprising:

(i) a copolymer which comprises constitutional repeating units of a hydroxystyrene type, has a weight average molecular weight of 2,000 to 4,000, and has a ratio of the weight average molecular weight to the number average molecular weight falling within 1.0 to 2.0; and (ii) a hydroxystyrene homopolymer; and wherein the dissolution rate of said ingredient (A) at 23° C. in a 2.38% by weight tetramethylammonium hydroxide aqueous solution falls within 80 to 300 nm/s;

wherein said copolymer of the ingredient (i) comprises constitutional repeating units of a hydroxystyrene type and constitutional repeating units of a non-hydroxystyrene type, and said non-hydroxystyrene-type constitutional repeating units are styrene constitutional repeating units.

3. The chemical-amplification-type negative resist composition according to claim 1 or 2, wherein the mole ratio of said hydroxystyrene-type constitutional repeating units and said non-hydroxystyrene-type constitutional repeating units is 80:20 to 90:10.

4. The chemical-amplification-type negative resist composition according to claim 3, wherein the dissolution rate of the ingredient (i) at 23° C. in a 2.38% by weight tetramethylammonium hydroxide aqueous solution falls within 50 to 200 nm/s.

5. The chemical-amplification-type negative resist composition according to claim 1 or 2, wherein the dissolution rate of the ingredient (i) at 23° C. in a 2.38% by weight tetramethylammonium hydroxide aqueous solution falls within 50 to 200 nm/s.

6. The chemical-amplification-type negative resist composition according to claim 1 or 2, wherein said ingredient (ii) has a weight average molecular weight of 2,000 to 4,000, and a ratio of the weight average molecular weight to the number average molecular weight falling within 1.0 to 2.0.

7. The chemical-amplification-type negative resist composition according to claim 1 or 2, wherein said ingredient (A) is a mixture comprising the ingredients (i) and (ii) in the weight ratio of 2:1 to 1:2.

8. The chemical-amplification-type negative resist composition according to claim 1 or 2, wherein said ingredient (B) comprises a compound represented by the following general formula 1:

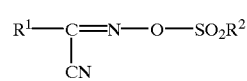

wherein each of $R^1$ and $R^2$ is independently a substituted or non-substituted saturated or unsaturated hydrocarbon group or an aromatic compound group, and at least one of $R^1$ and $R^2$ is not an aromatic compound group.

9. The chemical-amplification-type negative resist composition according to claim 1 or 2, wherein said ingredient (B) comprises a compound represented by the following general formula 2:

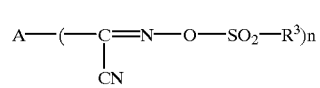

wherein A is a divalent or trivalent organic group, $R^3$ is a substituted or non-substituted hydrocarbon group, and n is 2 or 3.

10. A method for forming a negative resist pattern, comprising:

applying the chemical-amplification-type negative resist composition according to claim 1 or 2 onto a substrate, and drying it to form a resist film having a thickness of 3.0 to 6.0 μm;

selectively irradiating said resist film with an active ray having a wavelength of 300 to 500 nm; and performing a developing treatment in an alkaline aqueous solution.

* * * * *